United States Patent
Han et al.

(10) Patent No.: US 9,728,144 B2
(45) Date of Patent: Aug. 8, 2017

(54) METHOD AND APPARATUS FOR SHIFTING DISPLAY DRIVING FREQUENCY TO AVOID NOISE OF ELECTRONIC SENSOR MODULE

(71) Applicant: Samsung Electronics Co., Ltd., Suwon-si, Gyeonggi-do (KR)

(72) Inventors: Ju-Hee Han, Yongin-si (KR); Joo-Hoon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/596,466

(22) Filed: Jan. 14, 2015

(65) Prior Publication Data

US 2015/0207493 A1    Jul. 23, 2015

(30) Foreign Application Priority Data

Jan. 17, 2014  (KR) .................... 10-2014-0006060

(51) Int. Cl.
  *G09G 3/36*  (2006.01)
  *H03B 5/20*  (2006.01)
  *H03L 3/00*  (2006.01)
  *G09G 3/20*  (2006.01)

(52) U.S. Cl.
  CPC ............ *G09G 3/36* (2013.01); *G09G 3/20* (2013.01); *H03B 5/20* (2013.01); *H03L 3/00* (2013.01); *G09G 2330/021* (2013.01); *G09G 2330/06* (2013.01); *G09G 2340/0435* (2013.01)

(58) Field of Classification Search
  CPC ...... G09G 3/36; G09G 3/20; G09G 2330/021; G09G 2340/0435; G09G 2330/06; H03B 5/20; H03B 3/00; H03L 3/00
  See application file for complete search history.

(56) References Cited

U.S. PATENT DOCUMENTS

| 5,977,940 A * | 11/1999 | Akiyama ............ G09G 3/3614 345/205 |
| 6,246,070 B1 * | 6/2001 | Yamazaki ......... G02F 1/136227 257/347 |
| 7,136,039 B2 * | 11/2006 | Bu ........................ G09G 3/3648 345/100 |
| 2013/0286302 A1 * | 10/2013 | Fujioka ................ G09G 3/3648 349/12 |

FOREIGN PATENT DOCUMENTS

| KR | 10-2010-0048236 A | 5/2010 |
| KR | 10-2013-0039704 A | 4/2013 |

* cited by examiner

*Primary Examiner* — Lun-Yi Lao
*Assistant Examiner* — Jarurat Suteerawongsa
(74) *Attorney, Agent, or Firm* — Jefferson IP Law, LLP

(57) ABSTRACT

A method and apparatus for shifting a display driving frequency to avoid a noise of an electronic sensor module is provided. The method for operating of an electronic device includes detecting a driving frequency of a divider in an operating module of the electronic device, determining whether an offset exists in the detected driving frequency, and controlling an oscillation frequency of an oscillator in the operating module.

12 Claims, 9 Drawing Sheets

DSDF Control Information    [Hz]

| | Frequency [Hz] | Offset |
|---|---|---|
| 1 | 56.71~57.26 | -17 |
| 2 | 57.26~57.41 | -16 |
| 3 | 56.41~57.61 | -15 |
| ⋮ | ⋮ | ⋮ |
| 17 | 60.04~60.20 | -1 |
| 18 | 60.20~60.39 | 0 |
| 19 | 60.39~60.59 | 1 |
| ⋮ | ⋮ | ⋮ |
| 33 | 63.02~63.18 | 15 |
| 34 | 63.18~63.37 | 16 |
| 35 | 63.37~63.57 | 17 |

* DSDF: Display module Source Driving Frequecy

Port Management Information

| Port No. | Description | Control Info. |
|---|---|---|
| ⋮ | ⋮ | ⋮ |
| 5 | Display Module Control ASIC Interface | -- |
| ⋮ | ⋮ | ⋮ |
| 10 | Display Module Source Driving Frequecy Signal | DSDF Contorl Info. |
| 11 | Display Module Gate Driving Frequecy Signal | DGDF Contorl Info. |
| ⋮ | ⋮ | ⋮ |

FIG.6

DSDF Control Information [Hz]

| | Frequency [Hz] | Offset |
|---|---|---|
| 1 | 56.71~57.26 | -17 |
| 2 | 57.26~57.41 | -16 |
| 3 | 56.41~57.61 | -15 |
| ⋮ | ⋮ | ⋮ |
| 17 | 60.04~60.20 | -1 |
| 18 | 60.20~60.39 | 0 |
| 19 | 60.39~60.59 | 1 |
| ⋮ | ⋮ | ⋮ |
| 33 | 63.02~63.18 | 15 |
| 34 | 63.18~63.37 | 16 |
| 35 | 63.37~63.57 | 17 |

\* DSDF: Display module Source Driving Frequecy

FIG.7

DSDF Control Information [Hex]

|  | Frequency [Hex] | Offset |
|---|---|---|
| 1 | 886F ~ 89C3 | −17 |
| 2 | 8814 ~ 8870 | −16 |
| 3 | 879B ~ 8815 | −15 |
| ⋮ | ⋮ | ⋮ |
| 17 | 81C6 ~ 821F | −1 |
| 18 | 815D ~ 81C7 | 0 |
| 19 | 80F0 ~ 815E | 1 |
| ⋮ | ⋮ | ⋮ |
| 33 | 7BA7 ~ 7BF8 | 15 |
| 34 | 7B487 ~ 7BA8 | 16 |
| 35 | 7AE4 ~ 7B49 | 17 |

\* DSDF: Display module Source Driving Frequecy

FIG.8

METHOD AND APPARATUS FOR SHIFTING DISPLAY DRIVING FREQUENCY TO AVOID NOISE OF ELECTRONIC SENSOR MODULE

CROSS-REFERENCE TO RELATED APPLICATION(S)

This application claims the benefit under 35 U.S.C. §119(a) of a Korean patent application filed on Jan. 17, 2014 in the Korean Intellectual Property Office and assigned Serial number 10-2014-0006060, the entire disclosure of which is hereby incorporated by reference.

TECHNICAL FIELD

The present disclosure relates to a method and apparatus for shifting a display driving frequency to avoid noise of an electronic sensor module.

BACKGROUND

Various kinds of electronic devices such as smartphones, tablet Personal Computers (PCs), and the like include various modules such as a display module, a communication module, a power module, a sensor module, and the like. The modules may be referred to as operating modules, for example.

The modules may be operated at different driving frequencies in order to prevent mutual frequency interference. However, when the driving frequencies of the different operating modules may interfere with each another due to change in a surrounding environment, such as temperature change, a noise or malfunction.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and apparatus for shifting a display driving frequency to avoid a noise of an electronic sensor module to prevent a noise or malfunction due to driving frequency interference from different modules, in various kinds of electronic devices such as smartphones, tablet Personal Computers (PCs), and the like.

In accordance with an aspect of the present disclosure, a method for operating of an electronic device is provided. The method includes detecting a driving frequency of a divider in an operating module of the electronic device, determining whether an offset exists in the detected driving frequency, and controlling an oscillation frequency of an oscillator in the operating module.

In accordance with another aspect of the present disclosure, an electronic device is provided. The electronic device includes an operating module comprising an oscillator, a divider, and a driver, and a controller configured to detect a driving frequency of the divider and control an oscillation frequency of the oscillator when an offset exists.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6 illustrates a view showing port management information according to various embodiments of the present disclosure;

FIG. 7 illustrates a view showing frequency control information in the unit of Hertz according to various embodiments of the present disclosure;

FIG. 8 illustrates a view showing frequency control information in the unit of hex according to various embodiments of the present disclosure.

Throughout the drawings, like reference numerals will be understood to refer to like parts, components, and structures.

DETAILED DESCRIPTION

Figure 1:
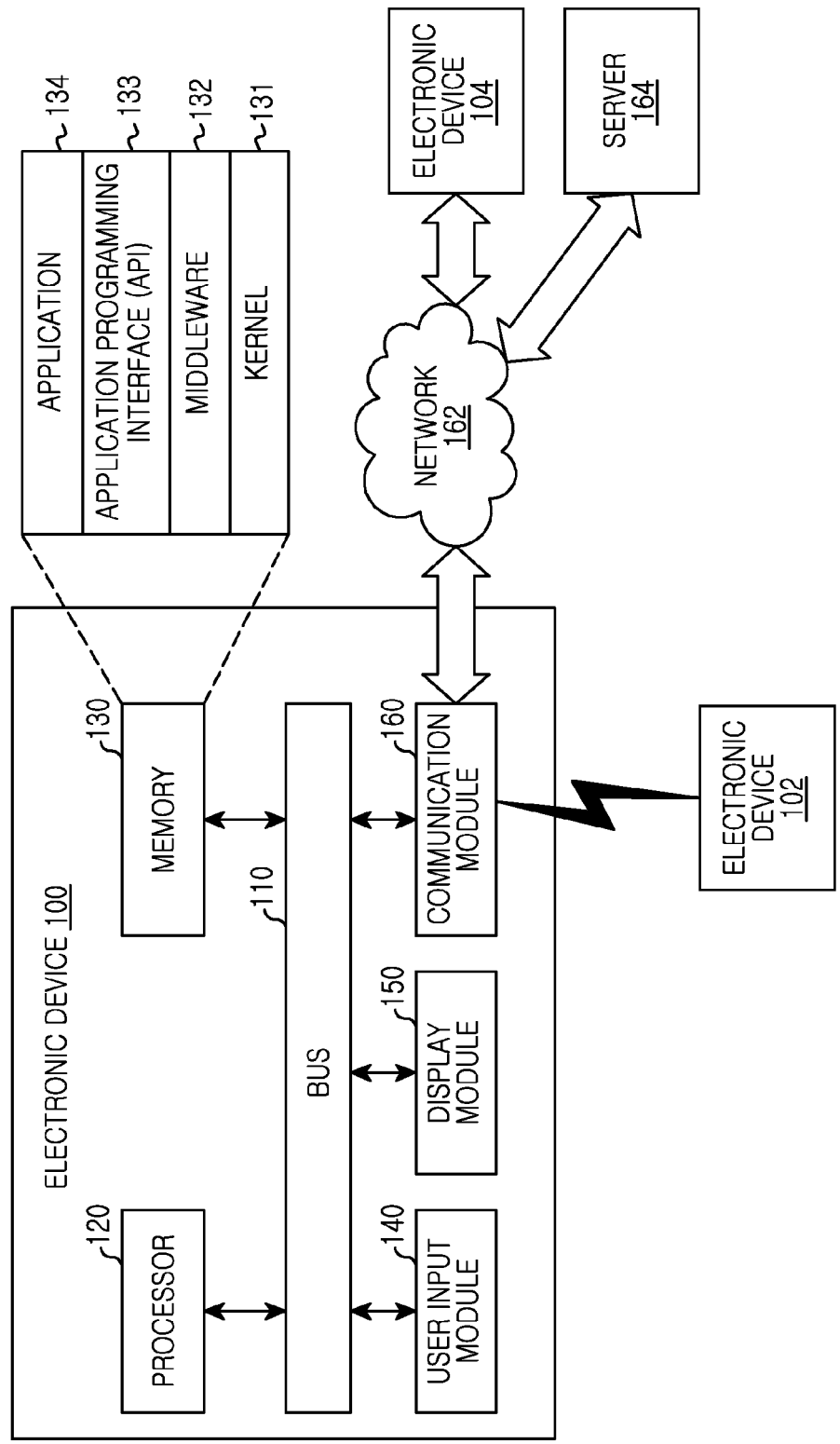
FIG. 1 illustrates a block diagram of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic device according to the present disclosure may be equipped with a communication function. For example, the electronic device may be a combination of one or more of various devices such as a smartphone, a tablet Personal Computer (PC), a mobile phone, a video phone, an electronic book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, a smart white appliance (e.g., a refrigerator, an air conditioner, a cleaner, an artificial intelligence robot, a TeleVision (TV), a Digital Video Disk (DVD) player, a stereo, an oven, a microwave oven, a washing machine, an air cleaner, an electronic album, and the like), various medical devices (e.g., Magnetic Resonance Angiography (MRA), Magnetic Resonance Imaging (MRI), Computerized Tomography (CT), a tomograph, an ultrasound machine, and the like), a navigation device, a Global Positioning System (GPS) receiver, an Event Data Recorder (EDR), a Flight Data Recorder (FDR), a set-top box, a TV box (e.g., Samsung HomeSync™, Apple TV™, or Goggle TV™), an electronic dictionary, an automotive infotainment device, electronic equipment for a ship (e.g., navigation equipment for ship, gyro compass, and the like), avionics, a security device, electronic clothing, an electronic key, a camcorder, a game console, a Head-Mounted Display (HMD), a flat panel display device, an electronic album, a part of furniture or a building/a structure including a communication function, an electronic board, an electronic signature receiving device, and a projector. In addition, the present disclosure is not limited to the above-mentioned devices.

FIG. 1 illustrates a block diagram of an electronic device according to various embodiments of the present disclosure.

Referring to FIG. 1, the electronic device 100 may include a bus 110, a processor 120, a memory 130, a user input module 140, a display module 150, and a communication module 160.

The bus 110 may be a circuit which connects the above-described elements with one another and transmits communication (e.g., a control message) between the above-described elements. The processor 120 may receive data from the other elements (e.g., the memory 130, the user input module 140, the display module 150, the communication interface 160, and the like) via the bus 110, decipher the data, and perform calculation or data processing according to the deciphered data.

The memory 130 may store instructions or data that is received from or generated by the processor 120 or the other elements (e.g., the user input module 140, the display module 150, the communication interface 160, and the like). For example, the memory 130 may include programming modules such as a kernel 131, middleware 132, an Application Programming Interface (API) 133, at least one application 134, and the like. Each of the above-described programming modules may be configured by software, firmware, hardware, or a combination of two or more of them.

The kernel 131 may control or manage system resources (e.g., the bus 110, the processor 120, the memory 130, and the like) that are used for performing operations or functions implemented in the other programming modules, for example, the middleware 132, the API 133, or the application 134. In addition, the kernel 131 may provide an interface for allowing the middleware 132, the API 133, or the application 134 to access, manage, and control elements of the electronic device 100.

The middleware 132 may serve as an intermediary to allow the API 133 or the application 134 to communicate with the kernel 131 and exchange data with the kernel 131. In addition, the middleware 132 may perform load balancing with respect to work requests received from any application 134, for example, by giving the application 134 priority to use the system resources of the electronic device 100 (e.g., the bus 110, the processor 120, the memory 130, and the like).

The API 133 is an interface for allowing the application 134 to control a function provided by the kernel 131 or the middleware 134, and, for example, may include at least one interface or function for controlling a file, controlling a window, processing an image, or controlling a text. The user input module 140 may receive instructions or data from the user and may transmit the instructions or data to the processor 120 or the memory 130 via the bus 110, and the display module 150 may display an image, a video, or data for the user.

The communication module 160 may connect communication between the electronic device 100 and another electronic device 102 and may support a predetermined short-range communication protocol (e.g., Wireless Fidelity (WiFi), Bluetooth (BT), Near Field Communication (NFC)) or a network communication 162 (e.g., the Internet, a Local Area Network (LAN), a Wire Area Network (WAN), a telecommunication network, a cellular network, a satellite network, or a Plain Old Telephone Service (POTS), and the like). The electronic device 102 may be the same as the electronic device 100 (the same type of electronic device) or may be different from the electronic device 100 (a different type of electronic device).

Figure 2:
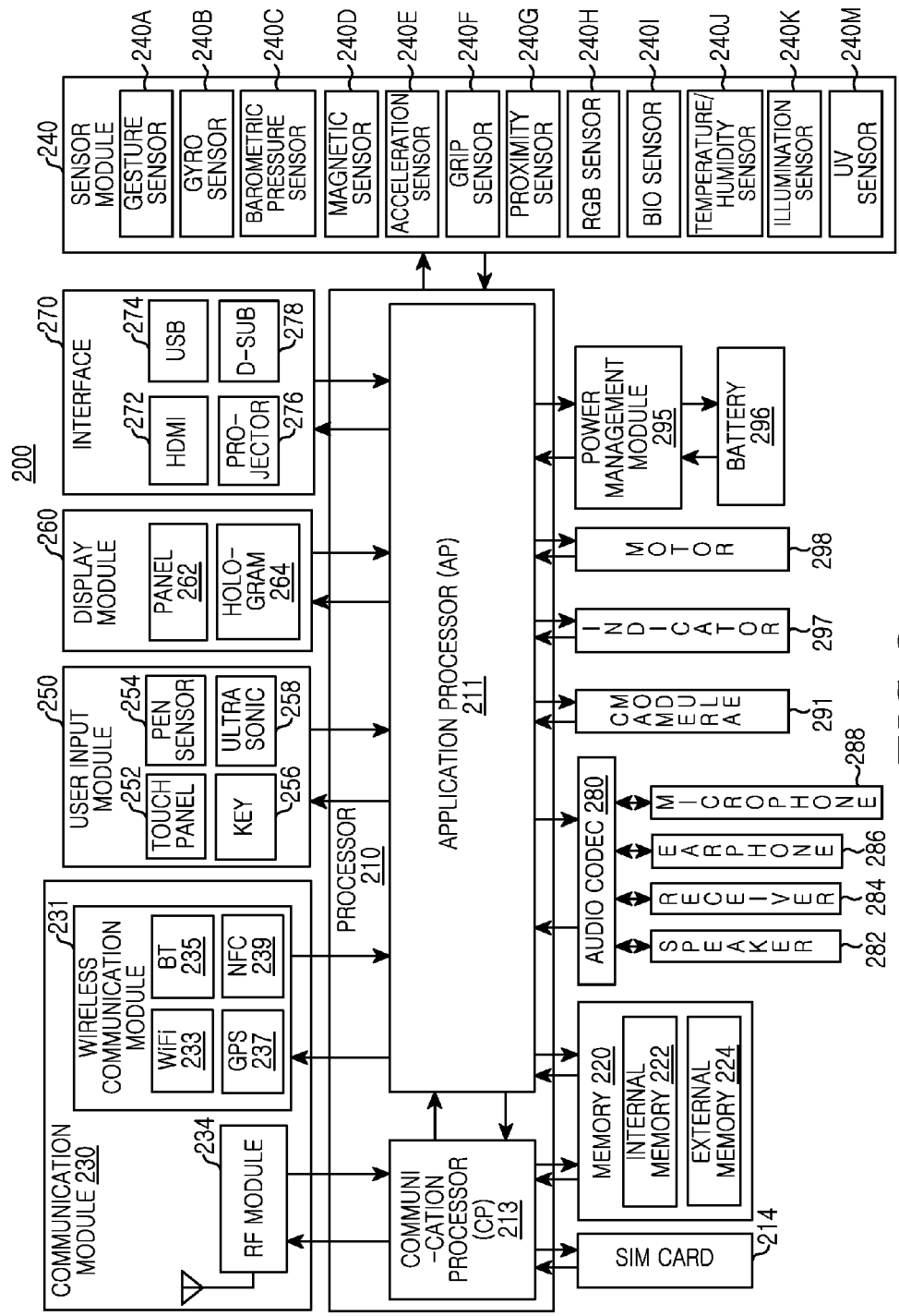
FIG. 2 illustrates a block diagram of hardware according to various embodiments of the present disclosure.

FIG. 2 illustrates a block diagram of hardware according to various embodiments of the present disclosure.

Referring to FIG. 2, the hardware 200, which may be an example of the electronic device 100, may include one or more processors 210, a Subscriber Identification Module (SIM) card 214, a memory 220, a communication module 230, a sensor module 240, a user input module 250, a display module 260, an interface 270, an audio codec 280, a camera module 291, a power management module 295, a battery 296, an indicator 297, and a motor 298.

The processor 210 (e.g., the processor 120) may include one or more Application Processors (APs) 211 and one or more Communication Processors (CPs) 213. The processor 210 may be the processor 120 shown in FIG. 1, for example. In FIG. 1, the AP 211 and the CP 213 are integral to the processor 210. However, the AP 211 and the CP 213 may be included in different Integrated Circuit (IC) packages. According to an embodiment of the present disclosure, the AP 211 and the CP 213 may be included in a single IC package.

The AP 211 may control a plurality of hardware or software elements connected to the AP 211 by driving an operating system or an application program, and may process and calculate a variety of data including multimedia data. For example, the AP 211 may be implemented by using a System on Chip (SoC). According to an embodiment of the present disclosure, the AP 210 may also include a Graphics Processing Unit (GPU) (not shown).

The CP 213 may manage a communication data link with other electronic devices connected via a network and may convert a data received in a communication protocol format into data. The CP 213 may be implemented by using a SoC, for example. According to an embodiment of the present disclosure, the CP 213 may perform part of multimedia control functions. The CP 213 may identify or authenticate a terminal in the communication network by using a subscriber identification module (e.g., the SIM card 214). In addition, the CP 213 may provide services such as voice communication, video communication, a text message service, or packet data to the user.

In addition, the CP 213 may control data exchange of the communication module 230. Although the elements like the CP 213, the power management module 295, or the memory 220 are separate elements from the AP 211 in FIG. 2, the AP 211 may be implemented to integrate at least a part of the above-described elements (for example, the CP 213) according to an embodiment of the present disclosure. According to an embodiment of the present disclosure, the AP 211 or the CP 213 may load an instruction or data, which is received from a non-volatile memory or other elements that are connected to the AP 211 and the CP 213, into a volatile memory and may process the instruction or data. In addition, the AP 211 or the CP 213 may store data which is received from other elements or data which is generated by the other elements in the non-volatile memory.

The SIM card 214 may be a card in which a subscriber identification module is implemented and may be inserted into a slot formed on a specific location of the electronic device. The SIM card 214 may include its unique identification information (for example, an Integrated Circuit Card IDentifier (ICCID)) or subscriber information (for example, International Mobile Subscriber Identity (IMSI)). The memory 220 may include an internal memory 222 and/or an external memory 224. For example, the memory 220 may implement the memory 130 as shown in FIG. 1.

For example, the internal memory 222 may include at least one of a volatile memory (for example, a Dynamic Random Access Memory (DRAM), a Static Random Access Memory (SRAM), a Synchronous DRAM (SDRAM), etc.) and a non-volatile memory (for example, an One-Time Programmable Read Only Memory (OTPROM), a Programmable Read Only Memory (PROM), an Erasable Programmable Read Only Memory (EPROM), an Electrically Erasable Programmable Read Only Memory (EEPROM), a mask ROM, a flash ROM, a NAND flash memory, a NOR flash memory, etc.). According to an embodiment of the present disclosure, the internal memory 222 may be a Solid State Drive (SSD). The external memory 224 may further include Compact Flash (CF), Secure Digital (SD), Micro-SD, Mini-SD, extreme Digital (xD), memory stick, etc.

The communication module 230 may include a wireless communication module 231 or a Radio Frequency (RF) module 234. For example, the communication module 230 may implement the communication module 160 shown in FIG. 1. For example, the wireless communication module 231 may include a WiFi module 233, a BT module 235, a GPS module 237, or an NFC module 239. The wireless communication module 231 may provide a wireless communication function using radio frequency. Additionally or alternatively, the wireless communication module 231 may include a network interface (e.g., a LAN card) or a modem for connecting the hardware 200 to a network (e.g., Internet, LAN, WAN, a telecommunication network, a cellular network, a satellite network, POTS, etc.)

The RF module 234 may exchange data, for example, may exchange RF signals or electronic signals. Although not shown, the RF module 234 may include a transceiver, a Power Amplifier Module (PAM), a frequency filter, or a Low Noise Amplifier (LNA), for example. In addition, the RF module 234 may further include a component for exchanging electromagnetic waves in free space, for example, a conductor or conducting wire.

The sensor module 240 may include at least one of a gesture sensor 240A, a gyro sensor 240B, a barometric pressure sensor 240C, a magnetic sensor 240D, an acceleration sensor 240E, a grip sensor 240F, a proximity sensor 240G, a Red, Green, Blue (RGB) sensor 240H, a biosensor 240I, a temperature/humidity sensor 240J, an illumination sensor 240K, or a UltraViolet (UV) sensor 240M. The sensor module 240 may measure a physical quantity or detect an operation state of the electronic device and convert measured or detected information into electric signals. Additionally or alternatively, the sensor module 240 may include an E-nose sensor (not shown), an ElectroMyoGraphy (EMG) sensor (not shown), an ElectroEncephaloGram (EEG) sensor (not shown), an ElectroCardioGram (ECG) sensor (not shown), a fingerprint sensor, etc. The sensor module 240 may further include a control circuit to control at least one sensor included therein.

The user input module 250 may include a touch panel 252, a pen sensor 254, a key 256, or an ultrasonic input device 258. The user input module 250 may implement the user input module 140 shown in FIG. 1. For example, the touch panel 252 may recognize a touch input via capacitive, resistive, infrared ray, and ultrasonic detection methods.

In addition, the touch panel 252 may further include a controller (not shown). In the case of a capacitive detection, the touch panel 252 may recognize direct physical contact and proximity of physical contact. The touch panel 252 may further include a tactile layer to provide a tactile response to the user. The pen sensor 254 may be implemented in the same or similar method as or to the method of receiving a user's touch input or by using a separate recognition sheet. The key 256 may be implemented by a keypad or a touch key that a user physically engages.

The ultrasonic input device 258 allows a terminal to detect sound waves through a microphone (e.g., the microphone 288) through a pen that generates ultrasonic signals, and is capable of wireless recognition. According to an embodiment of the present disclosure, the hardware 200 may receive a user input from an external device connected thereto (e.g., a network, a computer, or a server) by using the communication module 230. The display module 260 may include a panel 262 or a hologram 264. The display module 260 may implement the display module 150 shown in FIG. 1. For example, the panel 262 may be a Liquid Crystal Display (LCD) or an Active Matrix Organic Light Emitting Diode (AM-OLED).

The panel 262 may be implemented to be flexible, transparent, or wearable and may be configured as a single module along with the touch panel 252. The hologram 264 may show a stereoscopic image in the air using interference of light. According to an embodiment of the present disclosure, the display module 260 may further include a control circuit to control the panel 262 or the hologram 264.

The interface 270 may include a High Definition Multimedia Interface (HDMI) module 272, a Universal Serial Bus (USB) module 274, a projector 276, or a D-subminiature (D-sub) module 278. Additionally or alternatively, the interface 270 may include a Secure Digital (SD)/Multimedia Card (MMC) (not shown) or Infrared Data Association (IrDA) (not shown).

The audio CODEC 280 may bi-directionally convert a sound and an electric signal. For example, the audio CODEC 280 may convert sound information which is input or output through a speaker 282, a receiver 284, an earphone 286, or a microphone 288. The camera module 291 is a device for photographing an image and a moving image, and may include one or more image sensors (for example, a front surface sensor or a rear surface sensor), an Image Signal Processor (ISP) (not shown), or a flash LED.

The power management module 295 may manage power of the hardware 200. Although not shown, the power management module 295 may include a Power Management IC (PMIC), a charger IC, and a battery fuel gage. For example, the PMIC may be mounted in an integrated circuit or a SoC device such as the processor 210. The charging method may be divided into a wired charging method and a wireless charging method. The charger IC may charge a battery and may prevent inflow of overvoltage or overcurrent from a charger. According to an embodiment of the present disclosure, the charger IC may include a charger IC for at least one of the wired charging method and the wireless charging method. The wireless charging method may include a magnetic resonance method, a magnetic induction method, or an electromagnetic wave method, and an additional circuit for charging wirelessly, for example, a circuit such as a coil loop, a resonant circuit, a rectifier, etc. may be added.

The battery fuel gage may measure a remaining battery power of the battery 296, a voltage of the battery 296, a current of the battery 296, or a temperature during charging of the battery 296. The battery 296 generates electricity and supplies power. For example, the battery 296 may be a rechargeable battery. The indicator 297 may display a specific state of the hardware 200 or an element of the hardware 200 (e.g., the AP 211), for example, a booting state, a message state, or a charging state. The motor 298 may convert an electric signal into a mechanical vibration. A Micro Controller Unit (MCU) (not shown) may control the sensor module 240. Although not shown, the hardware 200 may include a processing device for supporting a mobile TV function (e.g., a GPU). The processing device for supporting the mobile TV function may process media data according to standards such as Digital Multimedia Broadcasting (DMB), Digital Video Broadcasting (DVB), or media flow.

The names of the above-described elements of the hardware according to various embodiments of the present disclosure may vary according to a type of the electronic device. The hardware according to various embodiments of the present disclosure may include at least one of the above-described elements, and some of the elements may be omitted or an additional element may be further included. In addition, some of the elements of the hardware according to various embodiments of the present disclosure may be combined into a single entity, and may perform the same functions as those of the elements before being combined.

Figure 3:
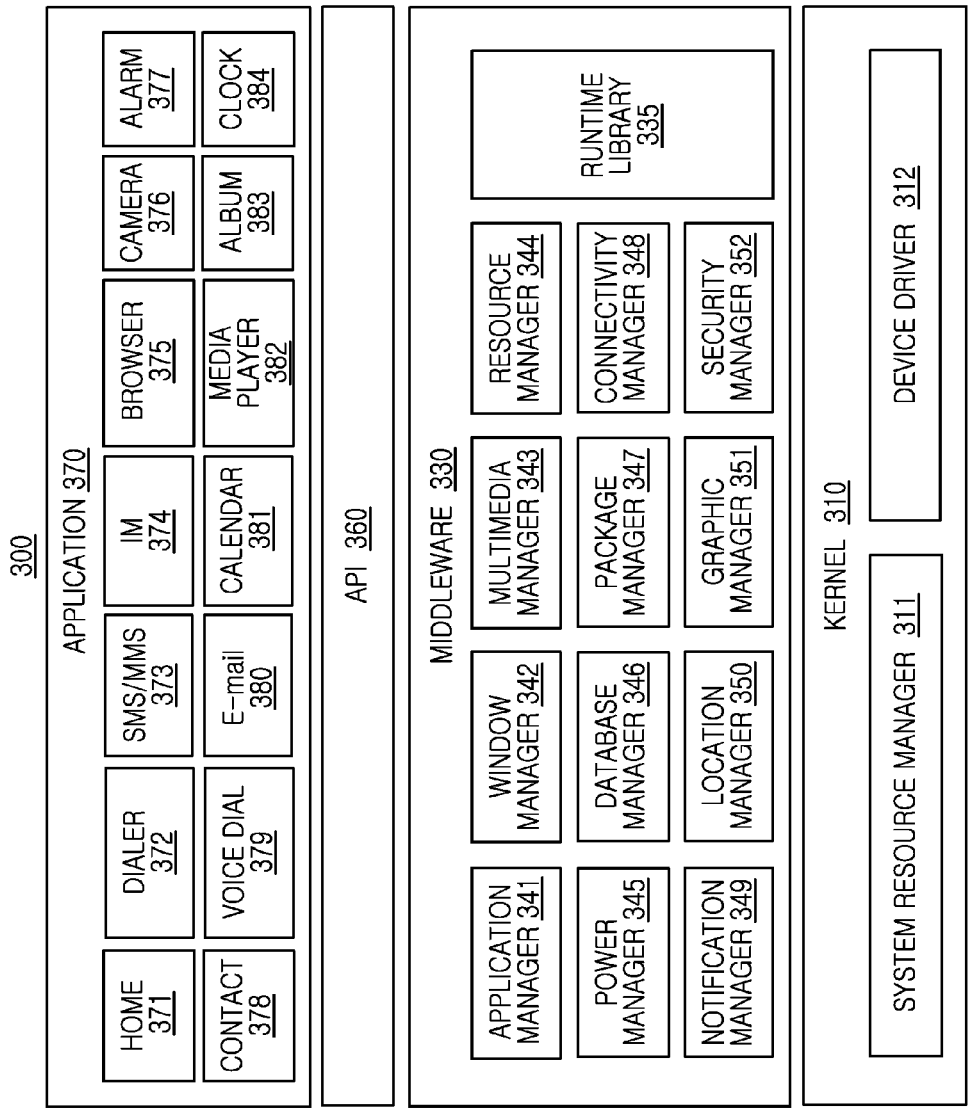
FIG. 3 illustrates a block diagram of a programming module according to various embodiments of the present disclosure.

FIG. 3 illustrates a block diagram of a programming module according to an embodiment of the present disclosure.

Referring to FIG. 3, a programming module 300 may be stored in the electronic device 100 (e.g., the memory 130) and may be implement by software firmware, hardware, or any combination of software, firmware, and hardware. The programming module 300 may be implemented in hardware (e.g., the hardware 200) and may include an Operation System (OS) for controlling resources related to an electronic device (e.g., the electronic device 100) or various applications (e.g., the application 370) executed in the OS. For example, the OS may be Android®, iOS®, Windows®, Symbian®, Tizen®, Bada®, or the like. Referring to FIG. 3, the programming module 300 may include a kernel 310, middleware 330, an Application Programming Interface (API) 360, and an application 370.

The kernel 310 (e.g., the kernel 131) may include a system resource manager 311 and a device driver 312. The system resource manager 311 may include a process manager, a memory manager, a file system manager, and the like, for example. The system resource manager 311 may control, allocate, or withdraw system resources. The device driver 312 may include various drivers (e.g., display driver, a camera driver, a Bluetooth driver, a shared memory driver, a USB driver, a keypad driver, a WiFi driver, or an audio driver) to interact with the various modules (e.g., display module 260, camera module 291, USB module 274, etc.). According to an embodiment of the present disclosure, the device driver 312 may include an Inter-Process Communication (IPC) (not shown) driver.

The middleware 330 may include a plurality of modules which provide functions that are common to the application 370. In addition, the middleware 330 may provide the functions through the API 360 such that the application 370 can effectively use limited system resources in the electronic device. For example, as shown in FIG. 3, the middleware 330 (e.g., the middleware 132) may include a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module which is used by a compiler to add a new function through a programming language while the application 370 is executed. According to an embodiment of the present disclosure, the runtime library 335 may perform functions of input/output, memory management, an arithmetic function, and the like. The application manager 341 may manage the execution of at least one of the applications 370, for example. The window manager 342 may manage Graphical User Interface (GUI) resources used in a screen.

The multimedia manager 343 reproduces various media files and encodes or decodes the media files by using a codec suited to the corresponding format. The resource manager 344 may manage resources such as a source code, a memory, and a storage space of at least one of the applications 370. The power manager 345 operates with a Basic Input/Output System (BIOS) to manage a battery or power and provide power information used for operation. The database manager 346 may manage generating, searching, or changing a database that is used in at least one of the applications 370.

The package manager 347 may manage installing or updating an application which is distributed as a package file. The connectivity manager 348 may manage wireless connection of WiFi, Bluetooth, and the like. The notification manager 349 may display or notify an event (e.g., message arrival, an appointment, a calendar event, and a notification of proximity) in such a manner that the event does not hinder the user. The location manager 350 may manage location information of the electronic device. The graphic manager 350 may manage a graphical effect to be provided to the user or a relevant user interface. The security manager 352 may provide a security function used for system security or user authentication. According to an embodiment of the present disclosure, when the electronic device (e.g., the electronic device 100) is equipped with a telephony function, the middleware 330 may further include a telephony manager (not shown) to manage a speech or video telephony function of the electronic device.

The middleware 330 may generate and use a new middleware module through a combination of various functions of the above-described element modules. The middleware 330 may provide a module which is customized according to a kind of OS to provide a distinct function. The middleware 330 may dynamically delete some of the existing elements or may add new elements. Accordingly, some of the elements described in the embodiment may be omitted or other elements may be further included or the elements may be substituted with elements of different names having similar functions.

The API 360 (e.g., the API 133) is a set of API programming functions and may be provided in a different configuration according to an OS. For example, in the case of Android® or IOS®, a single API set may be provided for each platform. In the case of Tizen®, two or more API sets may be provided. The application 370 (e.g., the application 134) may include a preloaded application or a third party application, for example.

At least part of the programming module 300 may be implemented by using instructions stored in a computer-readable storage medium. When the instructions are executed by one or more processors (e.g., the processor 210), the one or more processors may perform a function corresponding to the instructions. The computer-readable storage medium may be the memory 260, for example. At least part of the programming module 300 may be implemented (e.g., executed) by the processor 210.

At least part of the programming module 300 may include a module, a program, a routine, sets of instructions, or a process to perform one or more functions. The names of the elements of the programming module (e.g., the programming module 300) according to the present disclosure may vary according to the OS. In addition, the programming module according to the present disclosure may include one or more of the above-described elements, some of the elements may be omitted, or other additional elements may be added.

Various examples of the present disclosure will be described herein with reference to the accompanying drawings. In the following description, details of well-known functions or configurations will be omitted when they would obscure the subject matter of the present disclosure. Also, terms used herein may be defined in accordance with the functions of the present disclosure. Therefore, the terms should be understood based on the following description.

Hereinafter, a method and apparatus for shifting a display driving frequency to avoid noise of an electronic sensor module according to various embodiments of the present disclosure will be explained. An electronic device according to various embodiments of the present disclosure may include the elements shown in FIG. 2. For example, various electronic devices 200 (e.g., a smartphone, a tablet PC, and the like) may include operating modules such as a communication module 230, a sensor module 240, a user input module 250, a display module 260, a power management module 295 and the like.

The operating modules are operated by different driving frequencies to prevent mutual driving frequency interference. The operating module may include an oscillator, a divider, and a driver. The divider and the driver may be implemented as a control Application Specific Integrated Circuit (ASIC) and may be included in the operating module. The oscillator may use a Resistor Capacitor (RC) oscillator, for example. The RC oscillator can be integrated but it is susceptible to a surrounding environment such as temperature.

The processor 210 of the electronic device detects a driving frequency output from the divider of the operating module, determines whether an offset exists in the driving frequency, controls an oscillation frequency output from the oscillator in the operating module, and performs a frequency control operation to compensate for the offset included in the driving frequency, thereby preventing driving frequency interference from occurring among the operating modules.

The processor 210 may include a controller for performing the above-described frequency control operation. The controller may use a MCU that may be separate from the processor 210 or integral to the processor 210. The MCU may be implemented as a low power device and perform scheduled functions, thereby allowing the processor 210 to be placed into a sleep state to conserve battery power while continually monitoring, for example, the various sensor modules.

Figure 4:
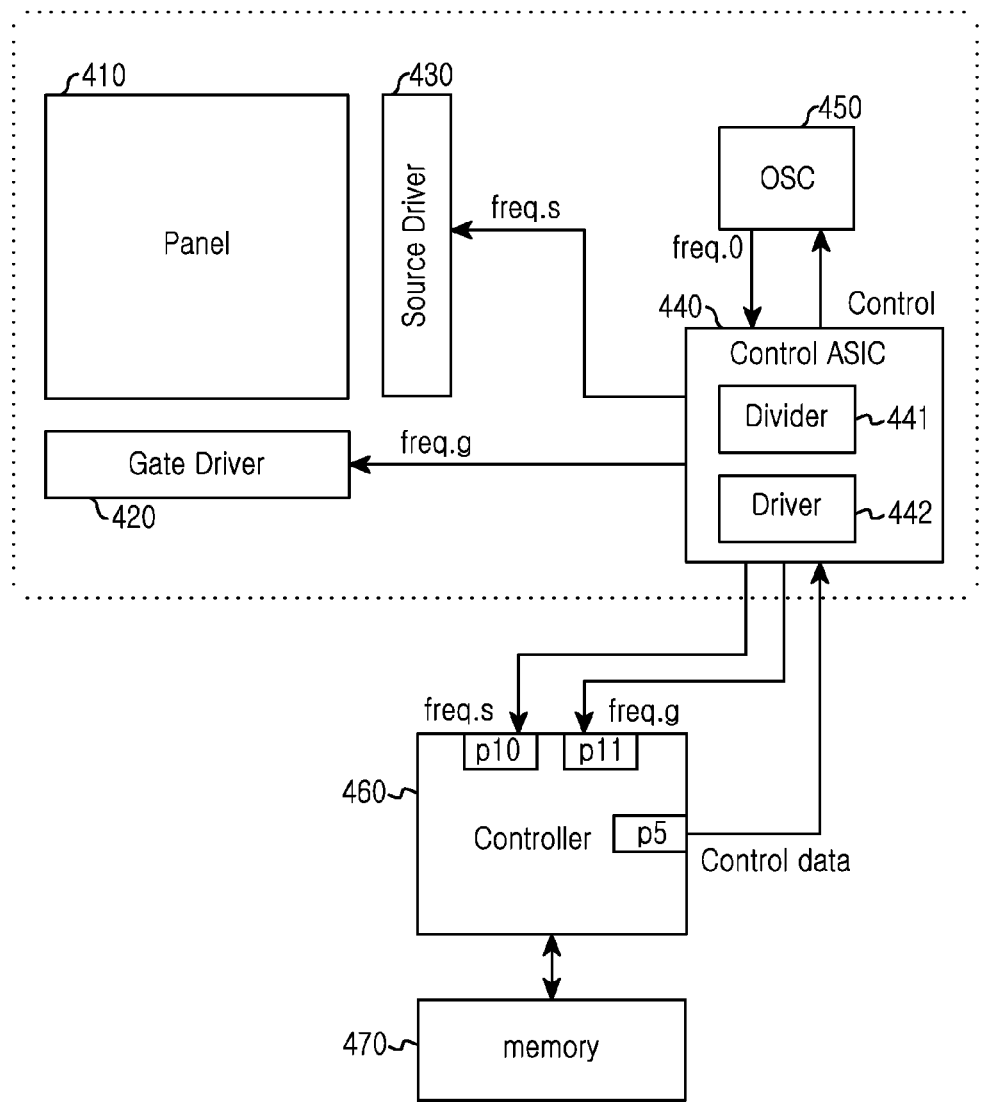
FIG. 4 illustrates a block diagram of a display module according to various embodiments of the present disclosure.

FIG. 4 illustrates a block diagram of a display module according to various embodiments of the present disclosure.

Referring to FIG. 4, the display module 400 may include a display panel 410, a gate driver 420, a source driver 430, a control ASIC 440, an oscillator 450, and the like. The oscillator 450 may use an RC oscillator, for example.

The control ASIC 440 may include a divider 441 to divide an oscillation frequency signal output from the oscillator 450 and output a plurality of driving frequency signals via different paths, and a driver 442 to control an oscillation frequency of an oscillation frequency signal output from the oscillator 450.

The divider 441 and the driver 442 may be included in the control ASIC 440 as a control logic. The divider 441 may divide an oscillation frequency signal (e.g., freq.0=9.26 MHz) that is output from the oscillator 450 to output a driving frequency signal (e.g., freq.g=153.3 KHz) for the gate driver 420 and a driving frequency signal (e.g., freq.s=60.4 Hz) for the source driver 430.

Figure 5:
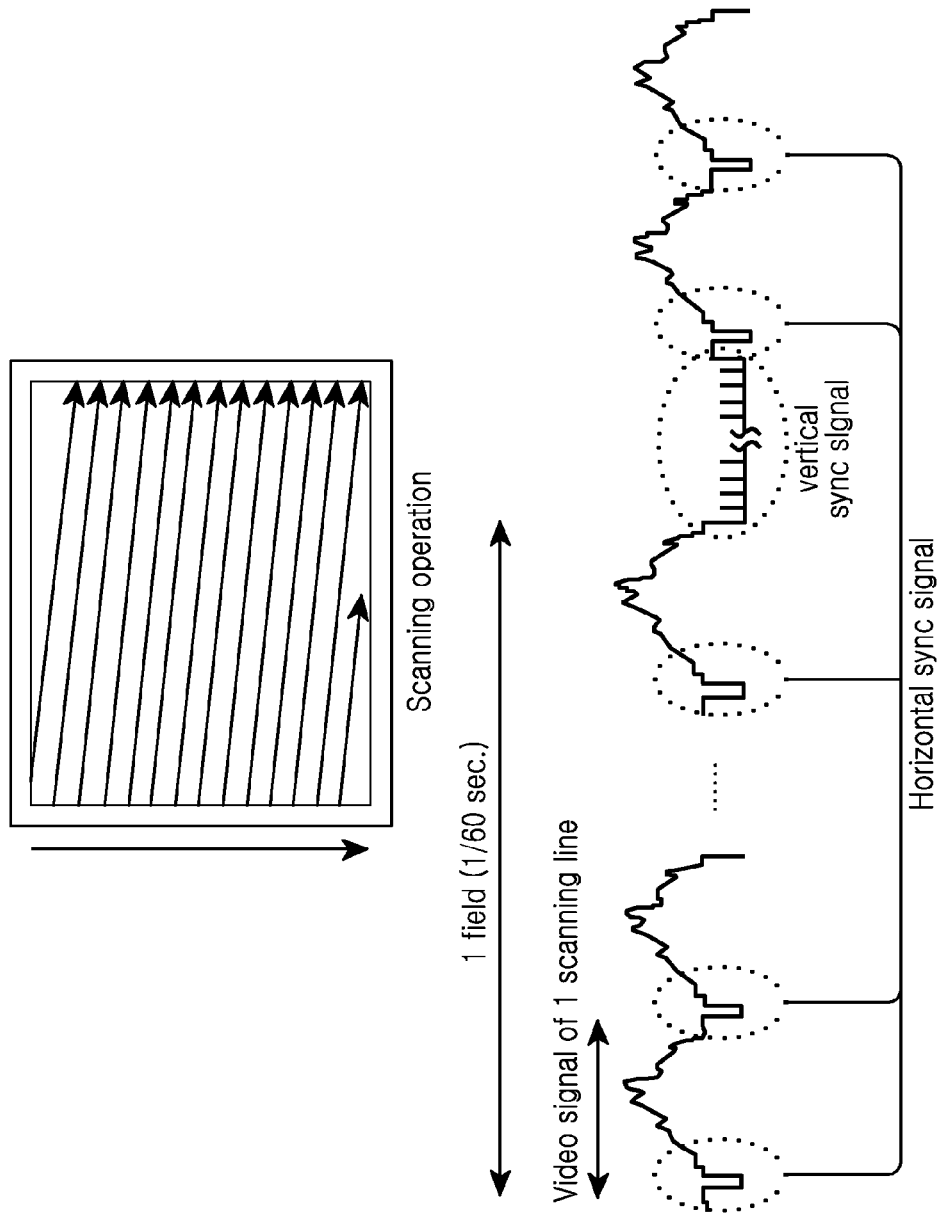
FIG. 5 illustrates a view showing a synchronization signal of a display module according to various embodiments of the present disclosure.

FIG. 5 illustrates a view showing a synchronization signal of a display module according to various embodiments of the present disclosure, FIG. 6 illustrates a view showing port management information according to various embodiments of the present disclosure, FIG. 7 illustrates a view showing frequency control information in the unit of Hertz according to various embodiments of the present disclosure, and FIG. 8 illustrates a view showing frequency control information in the unit of hex according to various embodiments of the present disclosure.

Referring to FIG. 5, the driving frequency signal (freq.g) of the gate driver 420 may operate as a horizontal synchronization (Hsync) signal of the display module 410 and the driving frequency signal (freq.s) of the source driver 430 may operate as a vertical synchronization (Vsync) signal of the display module 410. The driving frequency signal (freq.g) of the gate driver 420 and the driving frequency signal (freq.s) of the source driver 430 will be referred to as a gate signal and a source signal, respectively.

Referring back to FIG. 5, the divider 441 simultaneously outputs the gate signal to the gate driver 420 and the controller 460. The divider 441 also simultaneously outputs the source signal to the source driver 430 and the controller 460. The controller 460 may include ports to receive the gate signal and the source signal output and a port to output control data to the driver 442.

For example, as shown in FIG. 4, the source signal may be input to the port p10 of the controller 460 and the gate signal may be input to the port p11 of the controller. Only one of the gate signal and the source signal may be input to the controller 460.

The port p10 and the port p11 each may be coupled to an analog/digital converter (not shown) in the controller 460 to convert analogue signals into digital data, or the analogue/digital converter (not shown) may be installed at front ends of the port p10 and the port p11. That is, the controller 460 may receive the driving frequency signal of the divider 441, convert it into digital data, and then detect a driving frequency, or may receive a driving frequency which is converted into digital data by the analogue/digital converter installed at the front ends of the port p10 and the port p11.

The controller 460 may detect a driving frequency of one or more of the source signal and the gate signal, and determine whether an offset exists in the detected driving frequency by comparing the detected driving frequency and pre-set frequency control information. For example, heat may be constantly generated while the display panel 410 is running and thus internal temperature of the display module 400 may increase. Due to the increasing internal temperature, the oscillation frequency of the RC oscillator may affect the frequency output from the oscillator 450.

When the oscillation frequency of the RC oscillator changes due to temperature change, frequency values of the gate signal and the source signal also change from the allocated unique driving frequencies and thus a noise and malfunction may be caused by frequency interference.

The frequency control information is predetermined values, which are determined via extensive testing during design and manufacturing, for compensating for an offset existing in the driving frequency, and includes at least one offset value corresponding to a frequency range of the detected driving frequency. The frequency control information may be stored in a non-volatile memory 470 included in the processor 210 or may be stored in a non-volatile memory separate from the processor 210. The frequency control information may be entirely managed in association with management information stored in the non-volatile memory 470, for example, port management information, or may be managed separate from the port management information.

Referring to FIG. 6, for example, the port management information may include a unique number (e.g., port number) allocated to each port of the controller 460 and description information on each port.

The port management information may further include the frequency control information or may further include link information associated with the frequency control information. For example, as shown in FIG. 6, port No. 5 may include description information indicating that the 5$^{th}$ port is for a control data interface with the display module. Port No. 10 may include description information indicating that the 10$^{th}$ port is for receiving the source driving frequency signal of the display module and control information for controlling the source driving frequency of the display module. Port No. 11 may include description information indicating that the 11$^{th}$ port is for receiving the gate driving frequency signal of the display module and control information for controlling the gate driving frequency of the display module.

Referring to FIG. 7, the control information for controlling the source driving frequency of the display module may be named variously like Display module Source Driving Frequency (DSDF) control information as shown, for example. The DSDF control information may store respective offset values corresponding to the frequency range of the source driving frequency signal input through the 10$^{th}$ port in various forms such as a lookup table.

Referring back to FIG. 4, the offset value included in the DSDF control information is a frequency shift value for adjusting the oscillation frequency of the oscillator 450 to compensate for the offset included in the source driving frequency and result values of a previous test may be stored as the offset value. For example, when the range of the source driving frequency input through the 10$^{th}$ port p10 is 56.71 Hz to 57.26 Hz, the controller 460 retrieves the DSDF control information and selects an offset value of −17 to compensate for the offset of the source driving frequency. The controller 460 generates control data including the selected offset value of −17 and outputs the control data to the display module 400 through the port p5.

The control data may be output in various data formats such as Low Voltage Differential Signaling (LVDS), Mobile Industry Processor Interface (MIPI), Display Port (DP), AUXiliary (AUX), and the like. The driver 442 of the control ASIC 440 receives the control data and performs an oscillation frequency control operation to shift the oscillation frequency of the RC oscillator 440 according to the offset value of −17.

Accordingly, since the oscillation frequency input to the divider 441 is changed, the frequency value of the source driving frequency output through the divider 441 can be indirectly controlled. As described above, the controller 460 repeats detecting of the driving frequency and controlling the oscillation frequency such that the range of the source driving frequency is between 60.39 Hz and 60.59 Hz as shown in FIG. 7, for example. Referring to FIG. 8, the frequency control information may be managed in the units of Hertz or may be managed in units of hex as shown in FIG. 8.

Figure 9:
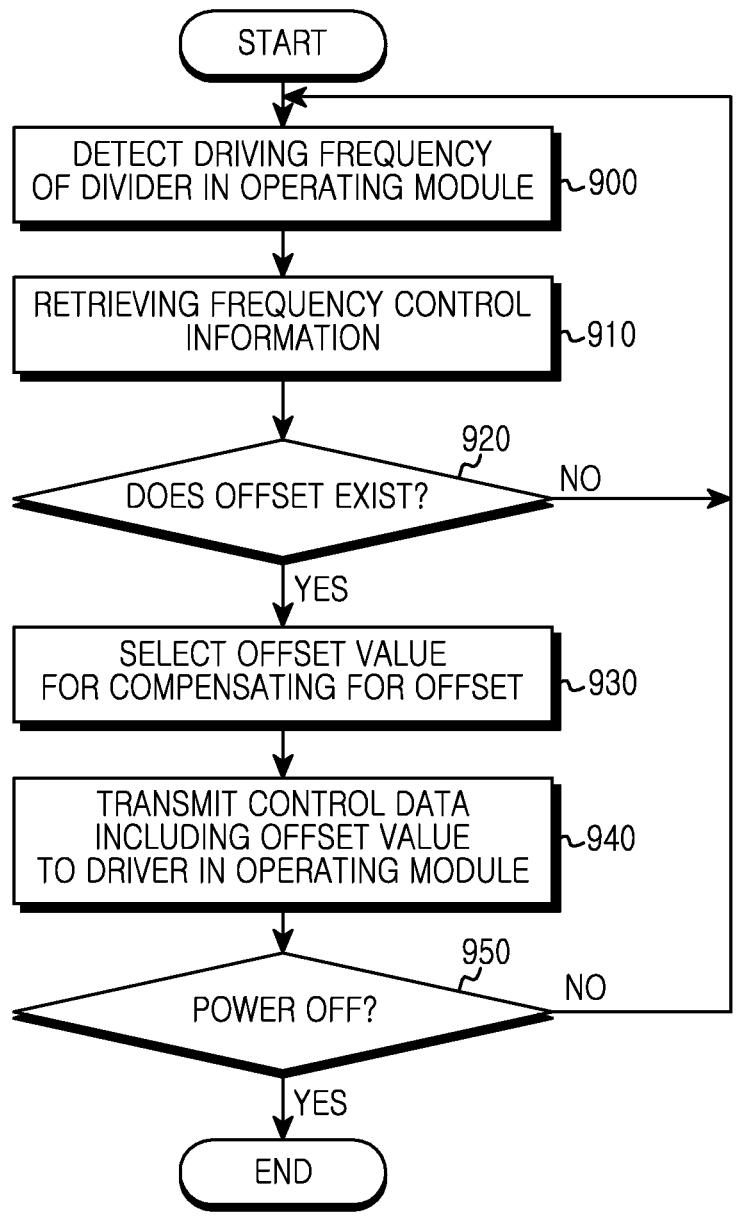
FIG. 9 illustrates a flowchart of a method for shifting a display driving frequency to avoid a noise of an electronic sensor module according to various embodiments of the present disclosure.

FIG. 9 illustrates a flowchart of a method for shifting a display driving frequency to avoid a noise of an electronic sensor module according to various embodiments of the present disclosure.

Referring to FIG. 9, the controller 460 detects a driving frequency of a divider included in an operating module in operation 900. For example, the controller 460 detects at least one of a gate driving frequency and a source driving frequency output from the divider 441 illustrated in FIG. 4. Herein, when the gate driving frequency operates as a horizontal synchronization signal (e.g., Hsync=153.3 KHz) and the source driving frequency operates as a vertical synchronization signal (e.g., Vsync=60.4 Hz), the controller 460 may detect the lower frequency, that is, the source driving frequency.

The controller 460 retrieves frequency control information stored in the memory 470 in operation 910 and determines whether an offset exists in the driving frequency by comparing the detected driving frequency and the frequency control information in operation 920. For example, when the detected driving frequency is a source driving frequency (freq.s) and the range of the source driving frequency is between 56.71 Hz and 57.26 Hz, the controller 460 selects an offset value of −17 from the frequency control information to compensate for the offset existing in the source driving frequency in operation 930. The controller 460 includes the selected offset value of −17 in control data and outputs the control data to the driver 442 of the display module 400 in operation 940. Thereafter, the above-described operations are repeated until the power is turned off in operation 950, such that the range of the source driving frequency is between 60.39 Hz and 60.59 Hz as shown in FIG. 7, for example.

The driver 442 receives the control data and performs an oscillation frequency control operation to shift the oscillation frequency of the RC oscillator 450 according to the offset value of −17 included in the control data. Accordingly, it is possible to automatically control the oscillation frequency even when the oscillation frequency of the RC oscillator is changed due to temperature. That is, even when there is an offset in the source driving frequency, mutual interference of the driving frequencies between the display module 400 and other operating modules can be prevented by automatically controlling the oscillation frequency and thus continuously outputting the unique driving frequency allocated to the source driving frequency (e.g., freq.s=60.4 Hz).

Various embodiments of the present disclosure may be applied to various operating modules in addition to the display module 400. For example, the embodiments may be applied to one or more of the communication module 230, the sensor module 240, the user input module 250, and the power management module 295 included in the electronic device 200. According to various embodiments of the present disclosure, when a driving frequency of a divider included in an operating module is detected and there is an offset in the driving frequency, the offset is compensated for by controlling an oscillator included in the operating module such that mutual interference of driving frequencies between different operating modules can be prevented.

Methods based on the embodiments disclosed in the claims and/or specification of the present disclosure can be implemented in hardware, software, or a combination of hardware and software. When implemented in software, a non-transitory computer readable recording medium for storing one or more programs (i.e., software modules) can be provided. The one or more programs stored in the non-transitory computer readable recording medium are configured for execution performed by one or more processors in an electronic device. The one or more programs include instructions for allowing the electronic device to execute the methods based on the embodiments disclosed in the claims and/or specification of the present disclosure.

The program (the software module or software) can be stored in a random access memory, a non-volatile memory including a flash memory, a ROM, an EEPROM, a magnetic disc storage device, a Compact Disc-ROM (CD-ROM), DVDs or other forms of optical storage devices, and a magnetic cassette.

Alternatively, the program can be stored in a memory configured in combination of all or some of these storage media. In addition, the configured memory may be plural in number. Further, the program can be stored in an attachable storage device capable of accessing the electronic device through a communication network such as the Internet, an Intranet, a LAN, a WLAN, or a Storage Area Network (SAN) or a communication network configured by combining the networks. The storage device can access via an external port to the electronic device according to the various embodiments of the present disclosure. In addition, a separate storage device on the communication network can access the device according to the various embodiments of the present disclosure.

In the above-described embodiments of the present disclosure, the elements included in the disclosure are expressed in a singular or plural form according to a detailed embodiment. However, the singular or plural expression is appropriately selected according to a proposed situation for the convenience of explanation and the disclosure is not limited to a single element or a plurality of elements. The elements expressed in the plural form may be configured as a single element and the elements expressed in the singular form may be configured as a plurality of elements.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for operating of an electronic device, the method comprising:
   detecting a driving frequency of a divider of a display module in the electronic device, the driving frequency being a frequency for driving a display panel, the driving frequency being, at the divider, generated based on an oscillation frequency received from an oscillator included in the display module;
   comparing the detected driving frequency with a pre-set frequency control information stored in a memory, the pre-set frequency control information comprising a plurality of frequency ranges, the plurality of frequency ranges respectively corresponding to a plurality of offset values;
   selecting an offset value among the plurality of offset values, the offset value corresponding to a frequency range which the detected driving frequency belongs to among the plurality of frequency ranges;
   generating control data comprising the offset value; and
   outputting the control data to a driver included in the display module,
   wherein the driver controls the oscillator based on the control data such that the oscillation frequency is shifted according to the offset value.

2. The method of claim 1, wherein the detecting of the driving frequency comprises converting a driving frequency signal of the divider in the display module into digital data.

3. The method of claim 1, wherein the offset value is determined by testing before manufacturing of the electronic device.

4. The method of claim 1, wherein the driving frequency comprises one or more of a gate driving frequency and a source driving frequency in the display module.

5. The method of claim 1,
   wherein the divider and the driver comprise a control Application Specific Integrated Circuit (ASIC) integral to the display module, and
   wherein the oscillator comprises a Resistor Capacitor (RC) oscillator integral to the display module.

6. A non-transitory computer-readable storage medium storing a program for performing the method according to claim 1.

7. An electronic device comprising:
   a display module comprising an oscillator, a divider, a driver, and a display panel; and
   a controller configured to:
      detect a driving frequency of the divider and control an oscillation frequency of the oscillator, the driving frequency being a frequency for driving the display panel, the driving frequency being, at the divider, generated based on an oscillation frequency received from the oscillator,
      compare the detected driving frequency with a pre-set frequency control information stored in a memory, the pre-set frequency control information comprising a plurality of frequency ranges, the plurality of frequency ranges respectively corresponding to a plurality of offset values,
      select an offset value among the plurality of offset values, the offset value corresponding to a frequency range which the detected driving frequency belongs to among the plurality of frequency ranges,
      generate control data comprising the offset value, and
      output the control data to the driver included in the display module, wherein the driver controls the oscillator based on the control data such that the oscillation frequency is shifted according to the offset value.

8. The electronic device of claim 7, wherein the controller is further configured to convert a driving frequency signal of the divider into digital data and detect the driving frequency, or receive the driving frequency converted into the digital data.

9. The method of claim 7, wherein the offset value is determined by testing before manufacturing of the electronic device.

10. The electronic device of claim 7, wherein the driving frequency comprises one or more of a gate driving frequency and a source driving frequency of the display module.

11. The electronic device of claim 7,
wherein the divider and the driver comprise a control Application Specific Integrated Circuit (ASIC) integral to the display module, and
wherein the oscillator comprises a Resistor Capacitor (RC) oscillator in the display module.

12. The electronic device of claim 7, wherein the controller comprises a micro control unit integral to a processor of the electronic device.

* * * * *